(12) United States Patent  
Song et al.

(10) Patent No.: US 12,402,469 B2
(45) Date of Patent: Aug. 26, 2025

(54) LIGHT-EMITTING DEVICE AND PREPARATION METHOD THEREOF

(71) Applicant: TCL TECHNOLOGY GROUP CORPORATION, Huizhou (CN)

(72) Inventors: Yinjie Song, Huizhou (CN); Jianxin Zhang, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 416 days.

(21) Appl. No.: 17/952,741

(22) Filed: Sep. 26, 2022

(65) Prior Publication Data

US 2023/0041674 A1 Feb. 9, 2023

Related U.S. Application Data

(63) Continuation of application No. PCT/CN2020/141667, filed on Dec. 30, 2020.

(30) Foreign Application Priority Data

Jul. 14, 2020 (CN) .......................... 202010672355.0

(51) Int. Cl.
*H10K 50/115* (2023.01)
*H10K 30/80* (2023.01)
(Continued)

(52) U.S. Cl.
CPC ......... *H10K 50/115* (2023.02); *H10K 30/865* (2023.02); *H10K 50/15* (2023.02);
(Continued)

(58) Field of Classification Search
None
See application file for complete search history.

(56) References Cited

U.S. PATENT DOCUMENTS

2020/0035935 A1    1/2020   Kim et al.

FOREIGN PATENT DOCUMENTS

| CN | 102983280 A | 3/2013 |
|---|---|---|
| CN | 107204392 A | 9/2017 |

(Continued)

OTHER PUBLICATIONS

World Intellectual Property Organization (WIPO) International Search Report for PCT/CN2020/141667 Apr. 16, 2021 6 Pages (Including Translation).

(Continued)

*Primary Examiner* — Anthony Ho
(74) *Attorney, Agent, or Firm* — ANOVA LAW GROUP, PLLC

(57) ABSTRACT

A preparation method of a light-emitting device includes forming a composite transition layer between a cathode and a quantum dot light-emitting layer and forming an anode on a surface of the quantum dot light-emitting layer away from the cathode. The composite transition layer includes a first transition layer, a second transition layer, and a third transition layer. The first transition layer is arranged on one side close to the cathode and includes a metal halide. The second transition layer is arranged on a surface of the first transition layer away from the cathode and includes a hydrogen halide. The third transition layer is arranged on a surface of the second transition layer away from the first transition layer and includes an ester compound.

20 Claims, 3 Drawing Sheets

(51) Int. Cl.
    *H10K 50/15*     (2023.01)
    *H10K 50/16*     (2023.01)
    *H10K 50/17*     (2023.01)
    *H10K 71/00*     (2023.01)
    *H10K 71/15*     (2023.01)
    *H10K 50/00*     (2023.01)
    *H10K 71/40*     (2023.01)
    *H10K 102/00*     (2023.01)

(52) U.S. Cl.
    CPC ........... *H10K 50/16* (2023.02); *H10K 50/171* (2023.02); *H10K 71/00* (2023.02); *H10K 71/15* (2023.02); *H10K 50/00* (2023.02); *H10K 71/441* (2023.02); *H10K 2102/351* (2023.02)

(56) References Cited

FOREIGN PATENT DOCUMENTS

| | | | |
|---|---|---|---|
| CN | 110600623 | A | 12/2019 |
| CN | 110890469 | A | 3/2020 |
| CN | 111146346 | A | 5/2020 |
| CN | 111384263 | A | 7/2020 |
| JP | 2007265637 | A | 10/2007 |

OTHER PUBLICATIONS

The European Patent Office (EPO) The Extended European Search Report for U.S. Appl. No. 20/945,306.Sep. 7, 2019, 2023 5 Pages.

Form a composite transition layer between a cathode and a quantum dot light-emitting layer, the composite transition layer including a first transition layer arranged on a side close to the cathode, the first transition layer including a metal halide, a second transition layer arranged on a surface of a side of the first transition layer away from the cathode, the second transition layer including a hydrogen halide, and a third transition layer arranged on a surface of a side of the second transition layer away from the first transition layer, the third transition layer including an ester compound ⟶ S10

Form an anode on a surface of a side of the quantum dot light-emitting layer away from the cathode to obtain the light-emitting device ⟶ S20

FIG. 1

LIGHT-EMITTING DEVICE AND PREPARATION METHOD THEREOF

CROSS-REFERENCE TO RELATED APPLICATIONS

This application is a continuation of International Application No. PCT/CN2020/141667, filed Dec. 30, 2020, which claims priority to Chinese Application No. 202010672355.0 filed Jul. 14, 2020, the entire contents of both of which are incorporated herein by reference.

TECHNICAL FIELD

The present disclosure generally relates to the display device technology field and, more particularly, to a light-emitting device and a preparation method thereof.

BACKGROUND

The description herein merely provides background information related to the present disclosure and does not necessarily constitute the existing technology. Quantum dot electroluminescence is a new type of solid-state lighting technology with advantages of low cost, lightweight, fast response speed, high color saturation, etc., has broad development prospects, and has become one of the important research directions of a new generation of LED display devices. Semiconductor quantum dot-based light-emitting diode (QLED) shows broad application prospects in display and lighting fields due to advantages of better monochromaticity, color saturation, and lower fabrication cost. After rapid development in recent years, the main performance indicators of the QLED such as luminous brightness, external quantum efficiency (EQE), and life have been greatly improved. How to make the device maintain high efficiency, long life, and high stability while maintaining high brightness is an urgent problem to be solved in the field of QLED, which is also a key technical bottleneck to restrict the application of QLED in the display and lighting fields. Balancing carrier injection of electrons and holes is an effective way to obtain a high-efficiency QLED device. In the current mass-produced QLED devices, a material of an electron transport layer adopts nano-inorganic zinc oxide nanoparticles, which leads to a very low electron injection barrier in addition to a high electron mobility. However, for holes, an organic polymer material is usually used as a hole transport layer, which not only result in a low mobility but also has a relatively high injection barrier.

Currently, an electron transport rate is often higher than a hole transport rate in a light-emitting device, which results in unbalanced carrier recombination in the light-emitting layer. Excess injection of electrons may easily cause self-light-emitting of a device functional layer such as the hole transport layer. Thus, the purity of emitted light and recombination efficiency of the quantum dot light-emitting device may be affected. Moreover, if the transport of the excess injected electrons in the quantum dot light-emitting layer is blocked, charges may be accumulated in the quantum dot light-emitting layer, which may significantly affect the light-emitting properties of the quantum dots. In addition, a metal electrode is easy to absorb water and oxygen during operation. When the water and oxygen enter the metal electrode, a bubble may be easily formed between the electrode and an oxide electron transport layer, which may eventually cause the electrode to peel off. In addition, the water and oxygen may easily enter other functional layers to damage the material of the functional layers, which causes the life time of the device to be reduced.

SUMMARY

Embodiments of the present disclosure provide a preparation method of a light-emitting device. The method includes forming a composite transition layer between a cathode and a quantum dot light-emitting layer and forming an anode on a surface of the quantum dot light-emitting layer away from the cathode. The composite transition layer includes a first transition layer, a second transition layer, and a third transition layer. The first transition layer is arranged on one side close to the cathode and includes a metal halide. The second transition layer is arranged on a surface of the first transition layer away from the cathode and includes a hydrogen halide. The third transition layer is arranged on a surface of the second transition layer away from the first transition layer and includes an ester compound.

Embodiments of the present disclosure provide a light-emitting device, including an anode, a cathode, a quantum dot light-emitting layer, and a composite transition layer. The anode and the cathode are arranged opposite to each other. The quantum dot light-emitting layer is arranged between the anode and the cathode. The composite transition layer is arranged between the cathode and the quantum dot light-emitting layer. The composite transition layer includes a first transition layer, a second transition layer, and a third transition layer. The first transition layer is arranged on a side close to the cathode and includes a metal halide. The second transition layer is arranged on a surface of the first transition layer away from the cathode and includes a hydrogen halide. The third transition layer is arranged on a surface of the second transition layer away from the first transition layer and includes an ester compound.

The preparation method of the light-emitting device of embodiments of the present disclosure has the beneficial effects of forming the composite transition layer between the cathode and the quantum dot light-emitting layer. The composite transition layer includes a first transition layer arranged on the side close to the cathode, and the first transition layer includes the metal halide. On one hand, an energy level of a lowest unoccupied molecular orbital (LUMO) of the metal halide in the first transition layer is between those of the electrode and adjacent functional layers such as an electron transport functional layer or a quantum dot light-emitting layer, which may effectively reduce the injection barrier of the electrons, reduce an interface barrier, slower material degradation caused by the accumulation of the charges at a barrier interface, and effectively improve the operation life of the device. On the other hand, the metal halide in the first transition layer has a function of blocking water and oxygen, which can effectively block water vapor and oxygen from entering into the halide functional layers of electrons, quantum dots, and holes of the device to improve the stability of the device and prolong the operation life of the device. The second transition layer is arranged on the surface of a side of the first transition layer away from the cathode. The second transition layer includes the hydrogen halide. A certain ionization effect can be generated when power is on to form an electric field to increase electron and hole transport efficiencies in the light-emitting device. Thus, recombination efficiency of electrons and holes in the light-emitting layer of the device is improved. The third transition layer is arranged on the surface of a side of the second transition layer away from the first transition layer. The third transition layer includes the ester compound, which has an organic insulation shielding function to reduce the electron transport rate and block redundant electron transport and injection. Thus, the electron and hole transport balance in the device is improved, which causes the carrier recombination in the light-emitting layer to be balanced and stable and improves the purity of emitted light of the device.

The light-emitting device of embodiments of the present disclosure has beneficial effects as follows. The light-emitting device of embodiments of the present disclosure includes an anode and a cathode arranged opposite to each other, a quantum dot light-emitting layer arranged between the anode and the cathode, a compound transition layer that is formed by stacking a first transition layer including a metal halide, a second transition layer including a hydrogen halide, and a third transition layer including an ester compound in sequence and arranged between the cathode and the quantum dot light-emitting layer. By adjusting the energy level and the interface barrier through the metal halide of the first transition layer in the compound transition layer, the material degradation may be slowed down caused by the cumulation of the charges at the barrier interface, and the operation life of the device may be effectively improved. In addition, the transition layer has the function of blocking water and oxygen, which can improve the stability and the operation life of the device. Through the electric field formed by the hydrogen halide of the second transition layer when the device is powered on, the recombination efficiency of the electrons and holes in the light-emitting layer of the device may be improved. By adjusting the electron injection and transport rate through the ester compound of the third transition layer, the electron and hole transport balance may be improved, which improves the balance and stability of the carrier recombination of the light-emitting layer and improve the purity of emitted light of the device.

BRIEF DESCRIPTION OF THE DRAWINGS

In order to describe the technical solutions of embodiments of the present disclosure more clearly, the drawings required in the description of embodiments or exemplary technologies will be briefly introduced below. Apparently, the drawings in the description below are only some embodiments of the present disclosure. For those of ordinary skill in the art, other drawings can also be obtained according to these drawings without any creative effort.

FIG. 1 is a schematic flowchart of a preparation method of a light-emitting device according to some embodiments of the present disclosure.

DETAILED DESCRIPTION OF THE EMBODIMENTS

Figure 2:
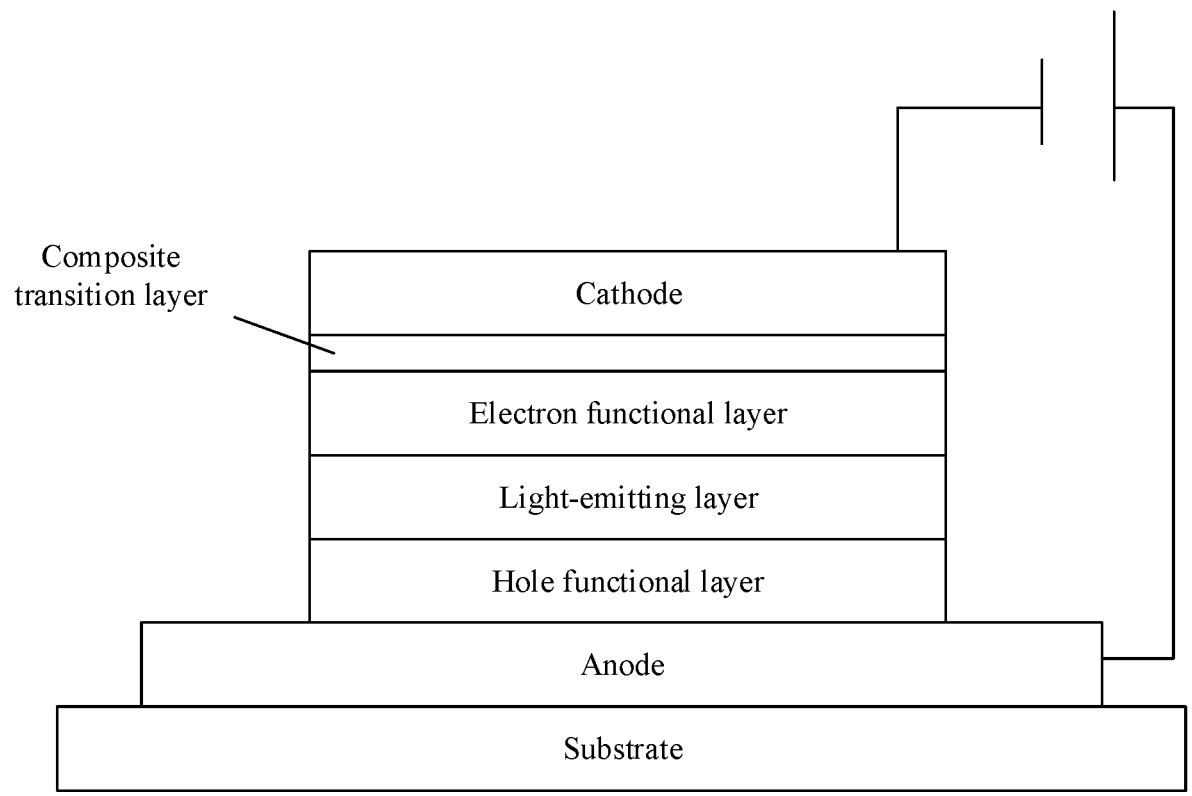
FIG. 2 is a schematic diagram of a forward structure light-emitting device according to some embodiments of the present disclosure.

In order to make the objectives, technical solutions, and advantages of the present disclosure clearer, the present disclosure is further described in detail below in connection with the accompanying drawings and embodiments. It should be understood that the specific embodiments described herein are only used to explain the present disclosure, and are not intended to limit the present disclosure.

It should be noted that when a component is referred to as being "fixed to" or "arranged at" another component. The component may be directly on or indirectly on the another component. When a component is referred to as being "connected to" another component, the component may be directly or indirectly connected to the another component. The orientation or positional relationship indicated by the terms "up," "down," "left," and "right," is based on the orientation or positional relationship shown in the drawings, and is merely to facilitate the description, rather than indicating or implying that the indicated device or element has to have a specific orientation and is constructed and operated in a specific orientation. Therefore, the terms are not to be understood as a limitation of the present disclosure. For a person of ordinary skill in the art, specific meanings of the above terms may be understood according to specific situations. The terms "first" and "second" are merely used to facilitate the description and cannot be understood as indicating or implying relative importance or implicitly indicating the number of technical features. The meaning of "a plurality of" may be two or more unless specified otherwise.

In order to describe the technical solution of the present disclosure, the following detailed description is made with reference to specific drawings and embodiments.

As shown in FIG. 1, some embodiments of the present disclosure provide a preparation method of a light-emitting device, including the following processes.

At S10, a composite transition layer is formed between a cathode and a quantum dot light-emitting layer. The composite transition layer includes a first transition layer, a second transition layer, and a third transition layer. The first transition layer is arranged on a side close to the cathode and includes a metal halide. The second transition layer is arranged on a surface of a side of the first transition layer away from the cathode and includes a hydrogen halide. The third transition layer is arranged on a surface of a side of the second transition layer away from the first transition layer and includes an ester compound.

At S20, an anode is formed on a surface of a side of the quantum dot light-emitting layer away from the cathode to obtain the light-emitting device.

In the preparation method of the light-emitting device of the present disclosure, the composite transition layer is formed between the cathode and the quantum dot light-emitting layer. The composite transition layer includes a first transition layer arranged on a side close to the cathode. The first transition layer includes the metal halide. On one hand, an energy level of a lowest unoccupied molecular orbital (LUMO) of the metal halide in the first transition layer is between those of the electrode and adjacent functional layers such as an electron transport functional layer or a quantum dot light-emitting layer. Thus, the injection barrier of the electrons may be effectively reduced, and the interface barrier may be reduced. The material degradation caused by an accumulation of charges at the barrier interface may be slowed down, and the operation life of the device may be effectively prolonged. On the other hand, the metal halide in the first transition layer may have a function of blocking water and oxygen, which can effectively block water vapor and oxygen from entering the halide functional layers of, e.g., electrons, quantum dots, and holes, of the device. Thus, the stability of the device may be improved, and the operation life of the device may be prolonged.

The second transition layer is arranged on the surface of a side of the first transition layer away from the cathode. The second transition layer includes a hydrogen halide, which can generate a certain ionization effect when being powered on to form an electric field and increase the electron and hole transport efficiencies in the light-emitting device. Therefore, the recombination efficiency of electrons and holes in the light-emitting layer of the device may be improved. The third transition layer is arranged on the surface of a side of the second transition layer away from the first transition layer. The third transition layer includes an ester compound, which has the organic insulation shielding effect to reduce the electron transport rate and block redundant electron transport and injection. Thus, electron and hole transport balance in the device may be improved to cause the carrier recombination in the light-emitting layer to be balanced and stable and improve the purity of emitted light of the device.

In some embodiments, the preparation method of the light-emitting device includes the following processes.

At S10, a composite transition layer is formed between a cathode and a quantum dot light-emitting layer.

At S11, an electron transport layer is formed between the composite transition layer and the quantum dot light-emitting layer.

At S12, a hole functional layer is formed between the quantum dot light-emitting layer and the anode.

At S20, an anode is formed on a surface of a side of the quantum dot light-emitting layer away from the cathode to obtain a light-emitting device. The composite transition layer includes a first transition layer, a second transition layer, and a third transition layer. The first transition layer is arranged on a side close to the cathode and includes a metal halide. The second transition layer is arranged on a surface of a side of the first transition layer away from the cathode includes a hydrogen halide. The third transition layer is arranged on a surface of a side of the second transition layer away from the first transition layer and includes an ester compound. An electron transport layer is formed between the composite transition layer and the quantum dot light-emitting layer. A hole functional layer is formed between the quantum dot light-emitting layer and the anode.

In some embodiments, at S10, the composite transition layer is arranged between the cathode and the quantum dot light-emitting layer. In embodiments of the present disclosure, the first transition layer of the metal halide, the second transition layer of the hydrogen halide, and the third transition layer of the ester compound may be stacked in sequence to form the composite transition layer. By adjusting the energy level and the interface barrier through the metal halide of the composite transition, the material degradation caused by the cumulation of the charges at the barrier interface may be slowed down, and the operation life of the device may be effectively prolonged. The transition layer may also have the function of blocking the water and oxygen, which may improve the stability and the operation life of the device. By forming the electric field through the hydrogen halide when the device is powered on, the recombination efficiency of electrons and holes in the light-emitting layer of the device may be improved. By adjusting the electron injection and the transport rate through the ester compound, the electron and hole transport balance in the device may be improved, the balance and stability of the carrier recombination may be improved in the light-emitting layer, and the purity of emitted light of the device may be improved.

In some embodiments, the preparation method of the light-emitting device further includes forming the electron transport layer between the composite transition layer and the quantum dot light-emitting layer (S11). By arranging the electron transport layer between the composite transition layer and the quantum dot light-emitting layer, the stable transport and injection of the electrons may be benefited, unbalanced electron injection in the quantum dot light-emitting layer may be prevented, and the overall light-emitting efficiency of the device may be affected. The composite transition layer arranged between the cathode and the electron transport layer may be used to reduce the electron injection barrier between the electrode and the electron transport layer and prevent the electrons from accumulating at the barrier interface. Thus, the material degradation caused by the accumulation of the charges at the barrier interface may be reduced, and the operation life of the device may be effectively prolonged.

In some embodiments, forming the composite transition layer includes:

depositing an alcohol solution of an electron transport material on a surface of a side of a quantum dot light-emitting layer away from the anode to form an electron transport layer having an alcohol solvent (S01);

depositing an acyl halide compound solution on a surface of a side of the electron transport layer away from the quantum dot light-emitting layer and forming a third transition layer and a second transition layer on the electron transport layer in sequence, the third transition layer including an ester compound, and the second transition layer including a hydrogen halide (S02); and depositing a metal on the second transition layer to form a first transition layer and a metal cathode, the first transition layer including a metal halide (S03).

In embodiments of the present disclosure, forming the composite transition layer is simple. The formed functional layers may be tightly bonded to each other, which not only improves the photoelectric performance of the device but also improves the stability of the device.

At S01, the alcohol solution of the electron transport material may be deposited on the surface of a side of the quantum dot light-emitting layer without complete annealing to form the electron transport layer having the alcohol solvent. The alcohol solvent which is not completely dried provides for subsequent formation the third transition layer.

At S02, the acyl halide compound solution may be deposited on the surface of the electron transport layer. The deposited acyl halide compound may react with the alcohol solvent in the electron transport layer to generate the ester compound and hydrogen halide. The ester compound may be embedded and firmly bonded to the surface of the electron transport layer to form the third transition layer, which provides the stability of bonding the transition layer and the electron transport layer. The third transition layer may be used to adjust the electron injection and transport rate to improve electron and hole transport balance in the device, improve the carrier recombination balance and stability in the light-emitting layer, and improve the purity of emitted light of the device. The generated hydrogen halide may form the second transition layer.

At S03, the metal may be deposited on the second transition layer. The deposited metal may react with the hydrogen halide in the transition layer to generate the metal halide to form the stably bonded first transition layer with the metal halide on the surface of the metal electrode. The first transition layer may be used to adjust the energy level and the interface barrier to slow down the material degradation caused by the accumulation of the charges at the barrier interface and effectively improve the operation life of the device. The first transition layer may also have the function of blocking the water and oxygen to improve the stability and the service life of the device. A small amount of the hydrogen halide and the acyl halide compound which are not involved in the reaction may remain between the third transition layer and the first transition layer to form the second transition layer of the hydrogen halide. The second transition layer may have a certain ionization effect when the device is powered on to form an electric field to accelerate the electron and hole transport rate in the device and improve the recombination efficiency of electrons and holes in the light-emitting layer of the device.

In some other embodiments, forming the composite transition layer includes:

depositing a reaction solution of the acyl halide compound and the alcohol solvent on the surface of the electron transport layer to form a third transition layer and a second transition layer on the electron transport layer in sequence, the third transition layer including an ester compound, and the second transition layer including the hydrogen halide (S04); and depositing a metal on the second transition layer to form a first transition layer and a metal cathode in sequence, the first transition layer including a metal halide (S05).

To form the composite transition layer in embodiments of the present disclosure, a precursor liquid of the acyl halide and the alcohol solvent may be prepared first. A mixed solution having the ester compound and the hydrogen halide may be obtained from the reaction and then may be deposited on the electron transport layer. The third transition layer may be formed through the bonding of the ester compound and the electron transport layer. The hydrogen halide may form the second transition layer. Then, the metal cathode may be deposited in a vacuum vapor manner to cause the metal to react with the hydrogen halide to generate the metal halide. Thus, the composite transition layer may be obtained by stacking the third transition layer, the second transition layer, and the first transport layer in sequence.

In some embodiments, a general chemical formula of the acyl halide may be RCOX. R may be selected from hydrogen or a hydrocarbon group. X may be selected from fluorine, chlorine, bromine, and iodine. In embodiments of the present disclosure, the adopted halide that has the general formula RCOX may be easy to react with the alcohol solvent to generate the ester and the hydrogen halide. When the metal halide reacts with ethanol, the reaction formula is

The generated hydrogen halide may react with the metal to generate the metal halide. When the hydrogen halide reacts with the metal aluminum, the reaction formula is:

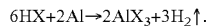

In some embodiments, the alcohol solvent may be at least one selected from, e.g., ethanol, propanol, n-butanol, pentanol, and isoamyl alcohol. In embodiments of the present disclosure, the alcohol solvent that is adopted may have a good dissolution and dispersion effect on the electron transport material, which may facilitate uniform deposition of the electron transport material to form a function film layer. The alcohol solvent may also have good reaction activity with the subsequently deposited acyl halide compound, which can rapidly react to generate the ester and the hydrogen halide to form the third transition layer of ester and the second transition layer of hydrogen halide to form the composite transition layer on the electron transport layer.

In some embodiments, the solvent in the acyl halide compound solution may be at least one selected from, e.g., benzene, acetone, diethyl ether, and chloroform. In embodiments of the present disclosure, since the reaction activity of the acyl halide compound with the alcohol solvent is relatively high, the acyl halide compound may be dissolved and diluted in a solvent such as benzene, acetone, diethyl ether, and chlorine that are relatively inert. Thus, the reaction rate of the acyl halide compound and the alcohol solvent in the electron transport layer may be effectively controlled to cause the alcohol solvent to fully react with the acyl halide compound. The generated ester may be firmly bonded to the surface of the electron transport layer to form the third transition layer with the uniform film layer.

In some embodiments, the concentration of the acyl halide compound solution may be 5-20 mg/ml. If the concentration of the acyl halide compound solution is too low, the generated ester compound may be too few, which is not beneficial to form the third transition layer of the ester compound that is dense and has uniform film layer on the electron transport layer. If the concentration of the acyl halide compound solution is too high, the acyl halide compound may not be beneficial for the acyl halide compound to stably and fully react with the alcohol solvent. Thus, excess acyl halide compound that does not react with the alcohol solvent may remain in the deposition layer. Therefore, the comprehensive performance of the composite transition layer may be reduced.

In some embodiments, a metal element in the metal halide may be the same as a metal element in the metal cathode. In some embodiments, the metal cathode may be formed by vacuum deposition on the composite transition layer. The deposited metal may simultaneously react with the hydrogen halide to generate a metal halide layer. The bonding stability may be good. The same metal element may be more beneficial to reduce the interface barrier. In some embodiments, the metal cathode may include at least one metal of Al, Ag, Cu, Mo, Au, Ba, Ca, or Mg.

In some embodiments, a thickness of the composite transition layer may be 10-20 nanometers. In some embodiments, a thickness of the third transition layer may be 5-10 nanometers. A thickness of the second transition layer may be greater than 0 nanometers and less than 4 nanometers. A thickness of the first transition layer may be 5-10 nanometers. If the film layers in the composite transition layer are too thick, electron transport may be reduced too much. Thus, more holes may be injected into the light-emitting layer than electrons, which may not be beneficial for the balance of the carrier recombination. If the film layers are too thin, the adjustment effect on the electron transport may be too weak, and the corresponding adjustment effect cannot be achieved.

In some other embodiments, the preparation method of the light-emitting device includes forming the first transition layer directly on the surface of the cathode by depositing the metal halide, depositing the hydrogen halide to form the second transition layer, and depositing the ester compound to form the third transition layer, so as to obtain the composite transition layer. The electron transport layer may be first formed on the surface of a side of the composite transition layer away from the cathode. Then, the quantum dot light-emitting layer may be formed. The hole transport layer may be first formed on the surface of the quantum dot light-emitting layer. Then, the anode may be formed to obtain the light-emitting device Correspondingly, embodiments of the present disclosure further provide a light-emitting device, including an anode, a cathode, a quantum dot light-emitting layer, and a composite transition layer. The anode and the cathode are arranged opposite to each other. The quantum dot light-emitting layer is arranged between the anode and the cathode. The composite transition layer is arranged between the cathode and the quantum dot light-emitting layer. The composite transition layer may include a first transition layer, a second transition layer, and a third transition layer. The first transition layer may be arranged on one side close to the cathode and includes a metal halide. The second transition layer is arranged on a surface of a side of the first transition layer away from the cathode side and includes a hydrogen halide. The third transition layer is arranged on a surface of a side of the second transition layer away from the first transition layer and includes an ester compound.

The light-emitting device of the present disclosure may include the anode and the cathode, the quantum dot light-emitting layer, and the composite transition layer. The anode and the cathode may be arranged opposite to each other. The quantum dot light-emitting layer may be arranged between the anode and the cathode. The composite transition layer may be arranged between the cathode and the quantum dot light-emitting layer and formed by stacking the first transition layer including the metal halide, the second transition layer including the hydrogen halide, the third transition layer including the ester compound in sequence. By adjusting an energy level and an interface barrier through the metal halide of the first transition layer in the composite transition layer, the material degradation caused by the cumulation of the charges at the barrier interface may be slowed down, and the operation life of the device may be prolonged. The transition layer may have the function of blocking water and oxygen, which can improve the stability and the service life of the device. An electric field may be formed by the hydrogen halide of the second transition layer when the device is powered on, which may improve the recombination efficiency of the electrons and the holes in the light-emitting layer of the device. By adjusting the electron injection and transport rate through the ester compound of the third transition layer, the balance of the electron and hole transport may be improved in the device, the balance and the stability of the carrier recombination may be improved in the light-emitting layer, and the purity of emitted light of the device may be improved.

In some embodiments, the thickness of the composite transition layer may be 10-20 nanometers. In some embodiments, the thickness of the third transition layer may be 5-10 nanometers. The thickness of the second transition layer may be greater than 0 nanometers and less than 4 nanometers. The thickness of the first transition layer may be 5-10 nanometers.

In some embodiments, the cathode may include at least one metal of Al, Ag, Cu, Mo, Au, Ba, Ca, or Mg.

In some embodiments, the metal element in the metal halide may be the same as the metal element in the cathode.

In some embodiments, the halogen in the first transition layer may be selected from fluorine, chlorine, bromine, and iodine.

The functions and effects of embodiments of the present disclosure are discussed in detail above, which are not repeated here. The light-emitting device of embodiments of the present disclosure may be prepared through the above method.

In some embodiments, the light-emitting device of embodiments of the present disclosure may have a forward structure or an inverted structure.

In some embodiments, a light-emitting device having a forward structure may include a stacked structure of an anode and a cathode arranged opposite to each other and a light-emitting layer arranged between the anode and the cathode. The anode may be arranged on a substrate. Hole functional layers such as a hole injection layer, a hole transport layer, and an electron block layer may be arranged between the anode and the light-emitting layer. Electron functional layers such as an electron transport layer, an electron injection layer, and a hole block layer may be arranged between the cathode and the light-emitting layer. As shown in FIG. 2A, a composite transition layer is formed between the cathode and the electron functional layer. In some forward structure device embodiments, the light-emitting device may include the substrate, the anode, a hole transport layer, a light-emitting layer, an electron transport layer, a composite transition layer, and a cathode. The anode may be arranged on a surface of the substrate. The hole transport layer may be arranged on a surface of the anode. The light-emitting layer may be arranged on a surface of the hole transport layer. The electron transport layer may be arranged on a surface of the light-emitting layer. The composite transition layer may be arranged on a surface of the electron transport layer. The cathode may be arranged on a surface of the composite transition layer.

Figure 3:
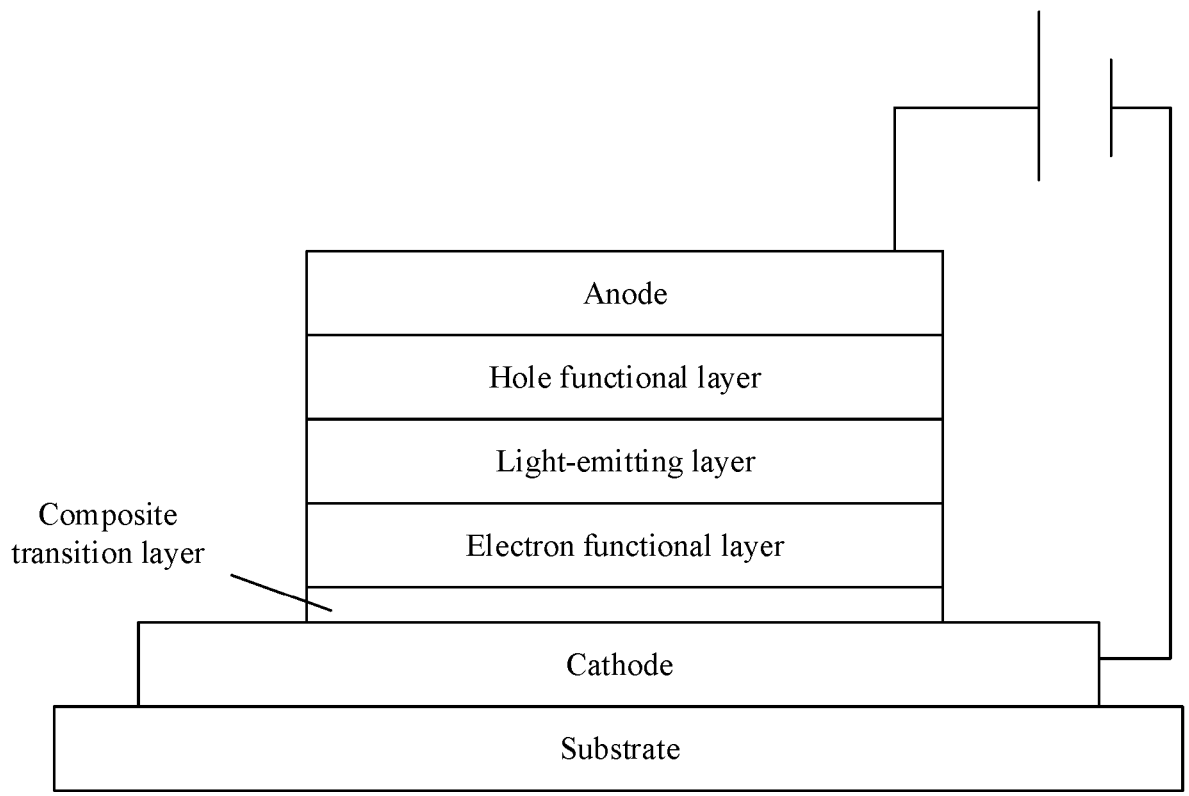
FIG. 3 is a schematic diagram of an inverted structure light-emitting device according to some embodiments of the present disclosure.

In some embodiments, an inverted structure light-emitting device may include a stacked structure of an anode and a cathode arranged opposite to each other and a light-emitting layer arranged between the anode and the cathode. The cathode may be arranged on a substrate. As shown in FIG. 3, hole functional layers such as a hole injection layer, a hole transport layer, and an electron block layer are arranged between the anode and the light-emitting layer. Electron functional layers such as an electron transport layer, an electron injection layer, and a hole block layer is arranged between the cathode and the light-emitting layer. A composite transition layer is further arranged between the cathode and the electronic functional layer. In some embodiments, the light-emitting device may include the substrate, the cathode, the composite transition layer, an electron transport layer, a light-emitting layer, a hole transport layer, and an anode. The cathode is arranged on a surface of the substrate. The composite transition layer is arranged on a surface of the cathode. The electron transport layer is arranged on a surface of the composite transition layer. The light-emitting layer is arranged on a surface of the electron transport layer. The hole transport layer is arranged on a surface of the light-emitting layer. The anode is arranged on a surface of the hole transport layer.

Further, in some embodiments, the substrate may include a rigid substrate or a flexible structure.

The anode may include one or more of indium-doped tin oxide (ITO), fluorine-doped tin oxide (FTO), antimony-doped tin oxide (ATO), and aluminum-doped zinc oxide (AZO).

The hole injection layer may include one or more of poly (3,4-ethylenedioxythiophene)-polystyrene sulfonic acid (PEDOT:PSS), undoped transition metal oxide, doped transition metal oxide, metal sulfide, and doped metal sulfide. For example, $WoO_3$, $MoO_3$, NiO, $V_2O_5$, HATCN (2,3,6,7,10,11-Hexacyano-1,4,5,8,9,12-hexaaza-benzo-phenanthrene), and CuS.

The hole transport layer may be selected from organic materials with hole transport capability, including but not limited to poly(9,9-dioctylfluorene-co-N-(4-butylphenyl)di-phenylamine (TFB), poly(9-vinylcarbazole) (PVK), poly(N,N'bis(4-butylphenyl)-N,N'-bis(phenyl)benzidine)(poly-TPD), poly(9,9-dioctylfluorene-co-bis-N,N'-(4-butylphenyl)-bis-N,N'-phenyl-1,4-phenylenediamine (PFB), 4,4',4"-tris(carbazol-9-yl)triphenylamine (TCTA), 4,4'-bis(9-carbazole)biphenyl (CBP), N,N'-bis(3-methylphenyl)-N,N'-diphenyl-[1,1-biphenyl]-4,4'-diamine (TPD), N,N'-diphenyl-N,N'-bis(1-naphthyl)-(1,1'-biphenyl)-4,4'-diamine (NPB), doped graphene, non-doped graphene, C60, or a mixture thereof. The hole transport layer material may also be selected from inorganic materials having the hole transport capability, including, but not limited to, doped or non-doped NiO, $WO_3$, $MoO_3$, CuO, or a mixture thereof.

The light-emitting layer may be a quantum dot light-emitting layer. The quantum dot may include one quantum dot of red, green, and blue, which includes, but is not limited to, at least one of II-IV semiconductor compound, II-VI semiconductor compound, II-V semiconductor compound, III-V semiconductor compound, III-VI semiconductor compound, IV-VI semiconductor compound, semiconductor compound, II-IV-VI semiconductor compound, or II-IV-V semiconductor compound, or a core-shell structure semiconductor compound formed by at least two of the above-mentioned semiconductor compounds. In some embodiments, the quantum dot light-emitting layer material may be at least one semiconductor nanocrystal compound selected from, e.g., CdSe, CdS, CdTe, ZnO, ZnSe, ZnS, ZnTe, HgS, HgSe, HgTe, and CdZnSe, or a semiconductor nanocrystal compound having a structure of a mixed type, a gradient mixing type, a core-shell structure type, or a combined type, etc., that is formed by at least two of CdSe, CdS, CdTe, ZnO, ZnSe, ZnS, ZnTe, HgS, HgSe, HgTe, and CdZnSe. In some other embodiments, the quantum dot light-emitting layer material may be at least one semiconductor nanocrystal compound selected from, e.g., InAs, InP, InN, GaN, InSb, InAsP, InGaAs, GaAs, GaP, GaSb, AlP, AlN, AlAs, AlSb, CdSeTe, and ZnCdSe, or a semiconductor nanocrystal compound having a structure of a mixed type, a gradient mixing type, a core-shell structure type, or a joint type, etc. that is formed by at least two of InAs, InP, InN, GaN, InSb, InAsP, InGaAs, GaAs, GaP, GaSb, AlP, AlN, AlAs, AlSb, CdSeTe, and ZnCdSe. In some other embodiments, the quantum dot light-emitting material may be at least one selected from a perovskite nanoparticle material (especially a luminescent perovskite nanoparticle material), a metal nanoparticle material, and a metal oxide nanoparticle material. The quantum dot materials may have the characteristics of the quantum dot and good photoelectric performance.

The electron transport layer may include an oxide semiconductor nanoparticle material with electron transport capability and having a band gap greater than a band gap of the light-emitting material, including, but not limited to, one or more of ZnO, $TiO_2$, $SnO_2$, $Ta_2O_3$, $ZrO_2$, NiO, TiLiO, ZnAlO, ZnMgO, ZnSnO, ZnLiO, and InSnO. The metal oxide nanomaterial may be prepared using a solution method. The alcohol solvent may be used.

The composite transition layer may be formed by stacking the first transition layer, the second transition layer, and the third transition layer in sequence in the above embodiments.

The cathode may include one or more of Al, Ag, Cu, Mo, Au, Ba, Ca, or Mg.

In order to enable the implementation details and operation of the present disclosure to be clearly understood by a those skilled in the art and apparently reflect the progress of the light-emitting device and the preparation method thereof of embodiments of the present disclosure, the technical solutions described above are illustrated by examples of a plurality of embodiments.

EXAMPLE 1

In some embodiments, a quantum dot light-emitting device, wherein a preparation method of the quantum dot light-emitting device comprises:
  depositing PEDOT:PSS on a transparent ITO anode substrate to form a hole injection layer (S11);
  depositing TFB on the hole injection layer to form a hole transport layer (S12);
  depositing CdZnSe/ZnS on the hole transport layer to form a quantum dot light-emitting layer (S13);
  depositing a zinc oxide nano-material ethanol solution on the quantum dot light-emitting layer, pre-annealing at 80° C. for 5 min, and removing the excess ethanol solvent (S14);
  dissolving 0.1 g of acetyl chloride with a purity higher than 99.8% in 10 ml benzene solvent, immediately depositing the acetyl chloride solution on the oxide electron transport layer, and standing for 20 min (S15);
  depositing an Ag metal cathode on an acyl halide transition layer in a vapor deposition manner (S16); and
  annealing at 80° C. for 30 min, packaging and curing, and completing the preparation of the quantum dot light-emitting device (S17).

EXAMPLE 2

In some embodiments, a quantum dot light-emitting device, wherein a preparation method of the quantum dot light-emitting device comprises:
  depositing PEDOT:PSS on a transparent ITO anode substrate to form a hole injection layer (S21);
  depositing TFB on the hole injection layer to form a hole transport layer (S22);
  depositing CdZnSe/ZnS on the hole transport layer to form a quantum dot light-emitting layer (S23);
  depositing a zinc oxide nano-material ethanol solution on the quantum dot light-emitting layer, pre-annealing at 80° C. for 5 minutes, and removing the excess ethanol solvent (S24);
  dissolving 0.15 g of benzoyl chloride with purity higher than 99.8% in 10 ml benzene solvent, immediately depositing the acetyl chloride solution on the oxide electron transport layer, and standing for 20 min (S25);
  depositing an Ag metal cathode on an acyl halide transition layer in a vapor deposition manner (S26); and
  annealing for 30 min at 80° C., packaging and curing, and completing the preparation of the quantum dot light-emitting device (S27).

EXAMPLE 3

In some embodiments, a quantum dot light-emitting device, wherein a preparation method of the quantum dot light-emitting device comprises:
  depositing PEDOT:PSS on a transparent ITO anode substrate to form a hole injection layer (S31);
  depositing TFB on the hole injection layer to form a hole transport layer (32);
  depositing CdZnSe/ZnS on the hole transport layer to form a quantum dot light-emitting layer (S33);
  depositing a zinc oxide nano-material ethanol solution on the quantum dot light-emitting layer, pre-annealing at 80° C. for 5 minutes, and removing the excess ethanol solvent (S34);
  dissolving 0.5 g acetyl chloride with purity higher than 99.8% in 10 ml benzene solvent, immediately depositing the acetyl chloride solution on the oxide electron transport layer, and standing for 20 min (S35);

depositing an Ag metal cathode on an acyl halide transition layer in a vapor deposition manner (S36);

annealing at 80° C. for 30 min, packaging and curing, and completing the preparation of a quantum dot light-emitting device (S37).

COMPARATIVE EXAMPLE 1

A quantum dot light-emitting device, wherein a preparation method of the quantum dot light-emitting device comprises:

depositing PEDOT:PSS on a transparent ITO anode substrate to form a hole injection layer (S41);

depositing TFB on the hole injection layer to form a hole transport layer (S42);

depositing CdZnSe/ZnS on the hole transport layer to form a quantum dot light-emitting layer (S43);

depositing a zinc oxide nano-material ethanol solution on the quantum dot light-emitting layer, and pre-annealing at 80° C. for 30 minutes to obtain an electron transport layer (S44);

depositing an Ag metal cathode on the electron transport layer in a vapor manner (S45); and annealing at 80° C. for 30 min, packaging and curing, and completing the preparation of the quantum dot light-emitting device (S46).

In order to verify the advantage of the quantum dot light-emitting devices prepared in examples 1-3 of the present disclosure over comparative example 1, the external quantum efficiency and life of the quantum dot light-emitting devices prepared in examples 1-3 and comparative example 1 are tested. The test results are shown in Table 1 below.

TABLE 1

| | Test Sample | | | |
|---|---|---|---|---|
| Test Method | Comparative Example 1 | Example 1 | Example 2 | Example 3 |
| EQE(%) | 5.1% | 6.3% | 5.9% | 6.6% |
| LT95@1000 nit | 34.7 h | 45.3 h | 43.2 h | 47.6 h |

It can be seen from the above test results that performances of the composite transition layer devices in Embodiments 1-3 of the present disclosure are significantly improved with respect to comparative example 1. The external quantum efficiency (EQE) is increased by about 20%, and the life (LT95@1000NIT: when the brightness of the device is 1000 NIT, the time needed for the brightness to reduce to 95%) is increased by about 30%.

The above are only optional embodiments of the present disclosure and are not intended to limit the present disclosure. For those skilled in the art, various changes and modifications can be made to the present disclosure. Any modifications, equivalent replacements, and improvements made within the spirit and principle of the present invention shall be within the scope of the claims of the present application.

What is claimed is:

1. A preparation method of a light-emitting device comprising:

forming a composite transition layer between a cathode and a quantum dot light-emitting layer, the composite transition layer including:

a first transition layer arranged on one side close to the cathode and including a metal halide;

a second transition layer arranged on a surface of the first transition layer away from the cathode and including a hydrogen halide; and a third transition layer arranged on a surface of the second transition layer away from the first transition layer and including an ester compound; and forming an anode on a surface of the quantum dot light-emitting layer away from the cathode.

2. The preparation method according to claim 1, further comprising:

forming an electron transport layer between the composite transition layer and the quantum dot light-emitting layer.

3. The preparation method according to claim 2, wherein forming the composite transition layer includes:

depositing an alcohol solution of an electron transport material on a surface of the quantum dot light emitting layer away from the anode to form the electron transport layer having an alcohol solvent;

depositing an acryl halide compound solution on a surface of the electron transport layer away from the quantum dot light-emitting layer to form the third transition layer and the second transition layer on the electron transport layer in sequence; and depositing a metal on the second transition layer to form the first transition layer and a metal cathode in sequence.

4. The preparation method according to claim 3, wherein a solvent in the acyl halide compound solution includes at least one of benzene, acetone, diethyl ether, or chloroform.

5. The preparation method according to claim 3, wherein a concentration of the acyl halide compound solution is 5-20 mg/mL.

6. The preparation method according to claim 2, wherein forming the composite transition layer includes:

depositing a reaction solution including an acyl halide compound and an alcohol solvent on a surface of the electron transport layer to form the third transition layer and the second transition layer on the electron transport layer in sequence; and depositing a metal on the second transition layer to form the first transition layer and the metal cathode in sequence.

7. The preparation method according to claim 6, wherein:

a general chemical formula of the acyl halide compound is RCOX;

R represents a hydrogen radical or a hydrocarbon radical; and

X represents an element selected from fluorine, chlorine, bromine, and iodine.

8. The preparation method according to claim 6, wherein the alcohol solvent includes at least one of ethanol, propanol, n-butanol, pentanol, or isoamyl alcohol.

9. The preparation method according to claim 1, wherein a thickness of the composite transition layer is 10-20 nanometers.

10. The preparation method according to claim 1, wherein a metal element in the metal halide is same as a metal element in the cathode.

11. The preparation method according to claim 1, wherein the cathode includes at least one of Al, Ag, Cu, Mo, Au, Ba, Ca, or Mg.

12. The preparation method according to claim 1, wherein:

a thickness of the third transition layer is 5-10 nanometers;

a thickness of the second transition layer is greater than 0 nanometers and less than 4 nanometers; and a thickness of the first transition layer is 5-10 nanometers.

13. The preparation method according to claim 1, further comprising:

forming an electron transport layer between the composite transition layer and the quantum dot light-emitting layer; and forming a hole functional layer between the quantum dot light-emitting layer and the anode.

14. The preparation method according to claim 13, wherein:

forming the composite transition layer includes sequentially depositing the metal halide, the hydrogen halide, and the ester compound on a surface of the cathode to form the first transition layer, the second transition layer, and the third transition layer, respectively; and the electron transport layer, the quantum dot light-emitting layer, the hole transport layer, and the anode are sequentially deposited on a surface of the composite transition layer away from the cathode.

15. A light-emitting device comprising:

an anode and a cathode arranged opposite to each other;

a quantum dot light-emitting layer arranged between the anode and the cathode; and a composite transition layer arranged between the cathode and the quantum dot light-emitting layer, the composite transition layer including:

a first transition layer arranged on a side close to the cathode and including a metal halide;

a second transition layer arranged on a surface of the first transition layer away from the cathode and including a hydrogen halide; and a third transition layer arranged on a surface of the second transition layer away from the first transition layer and including an ester compound.

16. The light-emitting device according to claim 15, wherein a thickness of the composite transition layer is 10-20 nm.

17. The light-emitting device according to claim 15, wherein the cathode includes at least one of Al, Ag, Cu, Mo, Au, Ba, Ca, or Mg.

18. The light-emitting device according to claim 15, wherein a metal element in the metal halide is same as a metal element in the cathode.

19. The light-emitting device according to claim 15, wherein a halogen in the first transition layer is selected from fluorine, chlorine, bromine, and iodine.

20. The light-emitting device according to claim 15, wherein:

a thickness of the third transition layer is 5-10 nanometers;

a thickness of the second transition layer is greater than 0 nanometers and less than 4 nanometers; and a thickness of the first transition layer is 5-10 nanometers.

* * * * *